United States Patent [19]

Ernst et al.

[11] Patent Number: 4,972,440
[45] Date of Patent: Nov. 20, 1990

[54] TRANSMITTER CIRCUIT FOR EFFICIENTLY TRANSMITTING COMMUNICATION TRAFFIC VIA PHASE MODULATED CARRIER SIGNALS

[75] Inventors: Gregory J. Ernst, Gaithersburg; Daniel M. Fraley, Jr., Germantown, both of Md.

[73] Assignee: Hughes Aircraft Company, Los Angeles, Calif.

[21] Appl. No.: 248,446

[22] Filed: Sep. 23, 1988

[51] Int. Cl.[5] ............................................. H04L 25/03
[52] U.S. Cl. ........................................ 375/60; 455/63; 332/145
[58] Field of Search .................. 375/59, 60; 330/149, 330/24 R; 455/42, 43, 63, 110, 102, 113; 332/9 R, 370

[56] References Cited

U.S. PATENT DOCUMENTS

| | | | |
|---|---|---|---|
| 3,973,201 | 8/1976 | Andren | 375/60 |
| 4,291,277 | 9/1981 | Davis et al. | 375/60 |
| 4,462,001 | 7/1984 | Girard | 330/149 |
| 4,573,133 | 2/1986 | White | 455/63 |
| 4,584,541 | 4/1986 | Nossen | 332/16 R |
| 4,592,073 | 5/1986 | Watanabe | 332/9 R |
| 4,675,618 | 6/1987 | Cross | 375/60 |
| 4,696,017 | 9/1987 | Masheff et al. | 375/60 |
| 4,706,262 | 11/1987 | Ohta | 455/126 |

OTHER PUBLICATIONS

Jerry J. Morton, "Spectral Shaping of Radio Frequency Waves", Technology Expo 86 Jan. 30-Feb. 1, 1986, pp. 609-623.
Gardiner et al., "Amplifiers with Feedforward Distortion Correction in Transmitter Multicouplings", Convention of Civil Land Mobile Radio, Teddington, UK, 1975, pp. 9-14.
Grier et al., "LR4 Series: Innovative Light Route Digital Radio", IEEE Int'l Conf on Communication, Chicago, Ill., Jun. 23-26, pp. 753-755.
Okinaka "Performance Characteristics of QPSK Signal Passing Nonlinear Channel in Digital Ship Station System", Electronic Communication Japan Part 1, vol. 69, No. 11, Nov. 1986, pp. 110-119.
Grier et al., "LR4 Series: Innovative Light Route Radio", IEEE Electronicom '85, Toronto, Canada, Oct 7-9, 1985, pp. 558-560.

Primary Examiner—Douglas W. Olms
Assistant Examiner—Stephen Chin
Attorney, Agent, or Firm—Steven M. Mitchell; Robert A. Westerlund; Wanda Denson-Low

[57] ABSTRACT

Transmitter for transmitting communication traffic via phase modulated carrier signals. The device provides for an efficient amplification of a phase modulated carrier signal using Class C amplifier technology. An envelope function is applied to the carrier signal by modulating the Class C amplifier with a related spectrum-suppressing amplitude envelope signal. Phase distortion accompanying the amplitude modulation of the Class C amplifier is compensated by generating a phase offset for the carrier signal. As each envelope function for suppressing the spectrum is generated, a corresponding phase offset may be applied to the carrier signal, avoiding the consequences of phase shift resulting from amplitude modulating the carrier signal in the Class C amplifier.

12 Claims, 4 Drawing Sheets

TRANSMITTER CIRCUIT FOR EFFICIENTLY TRANSMITTING COMMUNICATION TRAFFIC VIA PHASE MODULATED CARRIER SIGNALS

The present invention relates to remote communication communication systems. Specifically, an efficient transmitter is provided for phase modulating baseband data signals on a carrier signal, and amplifying the modulated signal using Class C amplifier technology.

It has previously been known in remote geographical locations to connect telephone subscribers to a central office via a radio communication link. The subscribers transmit and receive telephone conversations over a carrier signal which may be a TDMA carrier signal operating in L band or UHF. A plurality of such subscribers may be located near each other on separate carriers and communicate with a base station. The base telephone station will interface the radio link with standard telephone trunk lines.

In the past, certain constraints have been placed on these systems, vis a vis, the allowable bandwidth and protection against adjacent channel interference. The Federal Communications Commission has required that the signals occupy a limited bandwidth, and any sideband frequencies outside this bandwidth be suppressed to very low levels.

In carrying out the foregoing communication system, baseband communication signals are phase or frequency modulated on a carrier signal. To meet the foregoing spectral requirements, this phase modulated signal is further envelope modulated with an amplitude modulation signal component. This signal component is related to the baseband data signal used for phase modulating, so that the net spectrum produced has the foregoing bandwidth limitations.

In the past, the envelope function has been added to the phase modulated carrier at a low power level. Therefore, subsequent amplification stages have had linear amplification characteristics so as to preserve the envelope modulation signal while obtaining the required transmit power level.

Using the linear amplification circuitry of these prior art devices has several drawbacks. First, as is well known, Class A amplification stages are very power-inefficient. Additionally, the cost of providing for Class A amplification stages, sufficiently linear to preserve the envelope, is undesirable.

Given the foregoing disadvantages of using Class A amplification in these systems, the present invention has been implemented. The subject invention seeks to take advantage of Class C amplifiers for amplifying the required modulated signals to a power level sufficient to reliably communicate with a distant base station.

SUMMARY OF THE INVENTION

It is a primary object of this invention to provide a transmitter for transmitting communication traffic via a radio carrier to a base station.

It is a more specific object of this invention to take advantage of Class C amplifier technology to efficiently amplify carrier signals modulated with digitized voice or data traffic without distorting the modulated information.

These and other objects of the invention are obtained through the use of a standard Class C amplifier which will amplify a constant amplitude, phase or frequency modulated carrier signal. The Class C amplifier, as is known, will not under normal circumstances faithfully reproduce an envelope modulated signal. In the present invention, the required amplitude modulation component for maintaining the transmit frequency spectrum within the foregoing FCC limits, is added in the Class C amplifier stage. Thus, linear amplification of an envelope modulated signal is avoided by providing the amplitude modulation function in the last Class C amplifier stage of the transmitter.

In carrying out the invention, the Class C amplifiers provide for savings in power, as well as in the cost of providing the transmitter.

The present invention will apply the amplitude modulated signal through circuitry which amplitude modulates the Class C amplifier. The effect of amplitude modulating the Class C amplifier normally introduces a phase response which changes non-linearly for the applied amplitude modulating envelope signal. The present invention will provide for correction of this non-linear phase response so that the amplified signal does not suffer from phase distortion which would otherwise diminish the quality of recovered communication signals.

DESCRIPTION OF THE PREFERRED EMBODIMENT

Figure 1:
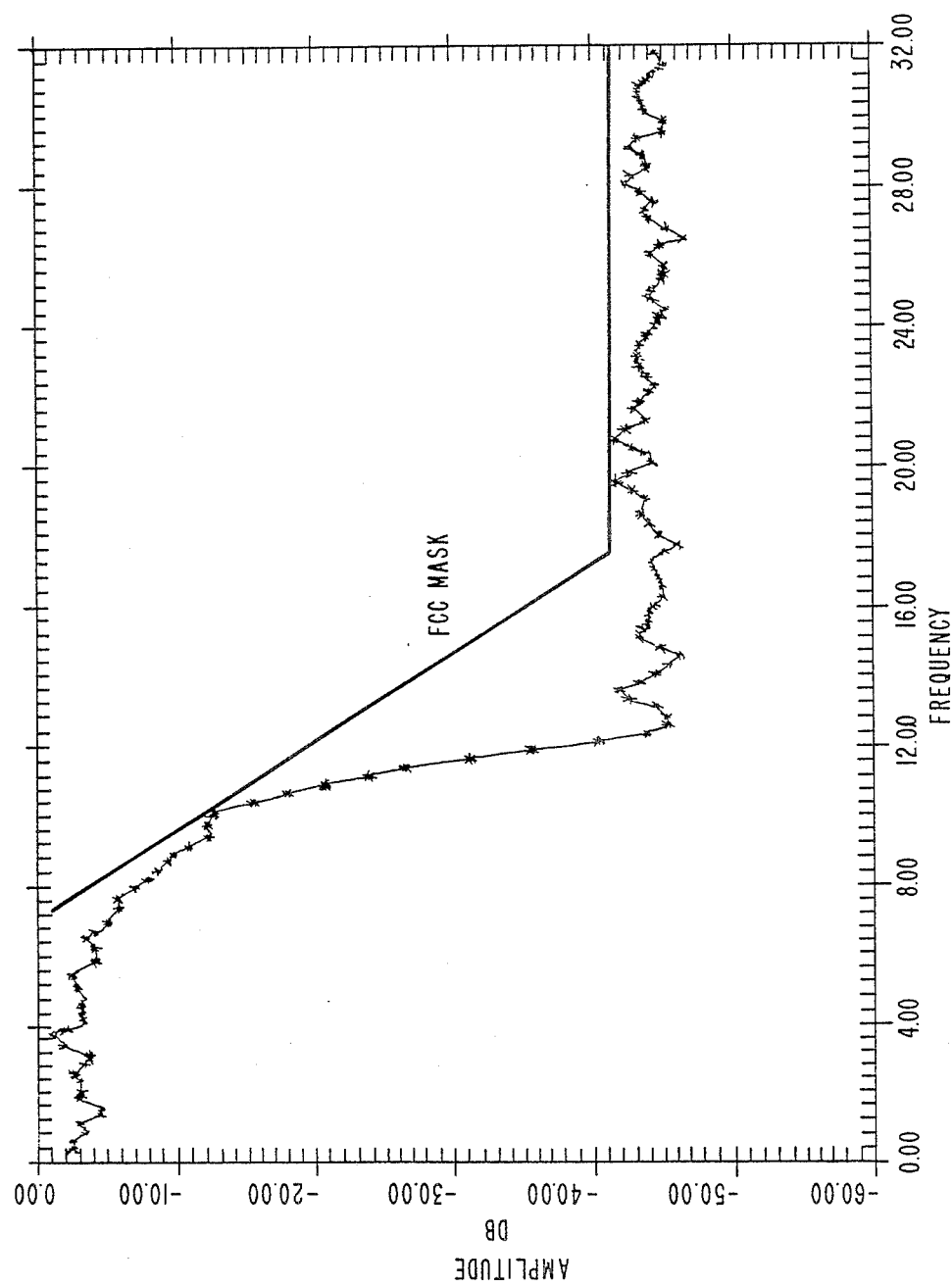
FIG. 1 illustrates the required frequency spectrum for remote communication station transmitters having the required adjacent channel frequency separation.

Referring now to FIG. 1, there is shown a frequency versus amplitude spectrum plot for a typical modulated transmitted signal which typically carries digitized voice or data traffic from a remote station. The relative output carrier signal power level is shown on one axis with the total spectrum energy decreasing rapidly to a constant level which begins at approximately 11 KHz from the nominal carrier frequency. At this point, the attenuation of the spectrum components beyond this bandwidth are below the level specified by the FCC regulations. The represented spectrum plot is for a carrier signal which includes an envelope modulated component of approximately 80% modulation depth, as well as a PM modulated component containing the baseband traffic. The baseband telephone traffic has been suitably filtered to assist in maintaining the spectrum within the shown bandwidth of FIG. 1. The solid line in FIG. 1 illustrate the aforesaid FCC bandwidth limitation requirement.

To achieve the foregoing spectral limitations, the AM component is added, not as an information-bearing signal, but as a spectrum-suppressing signal. It will be recognized by those skilled in the art that a carrier signal modulated in phase or frequency will produce a frequency spectrum proportional to SINX/X. The additional spectral sidebands which would normally extend out beyond the bandwidth shown, would exceed the limitations shown in FIG. 1 such that adjacent channel interference may be experienced with other transmitters operating in the same location, or number of transmitters operating into a base station.

Figure 2:
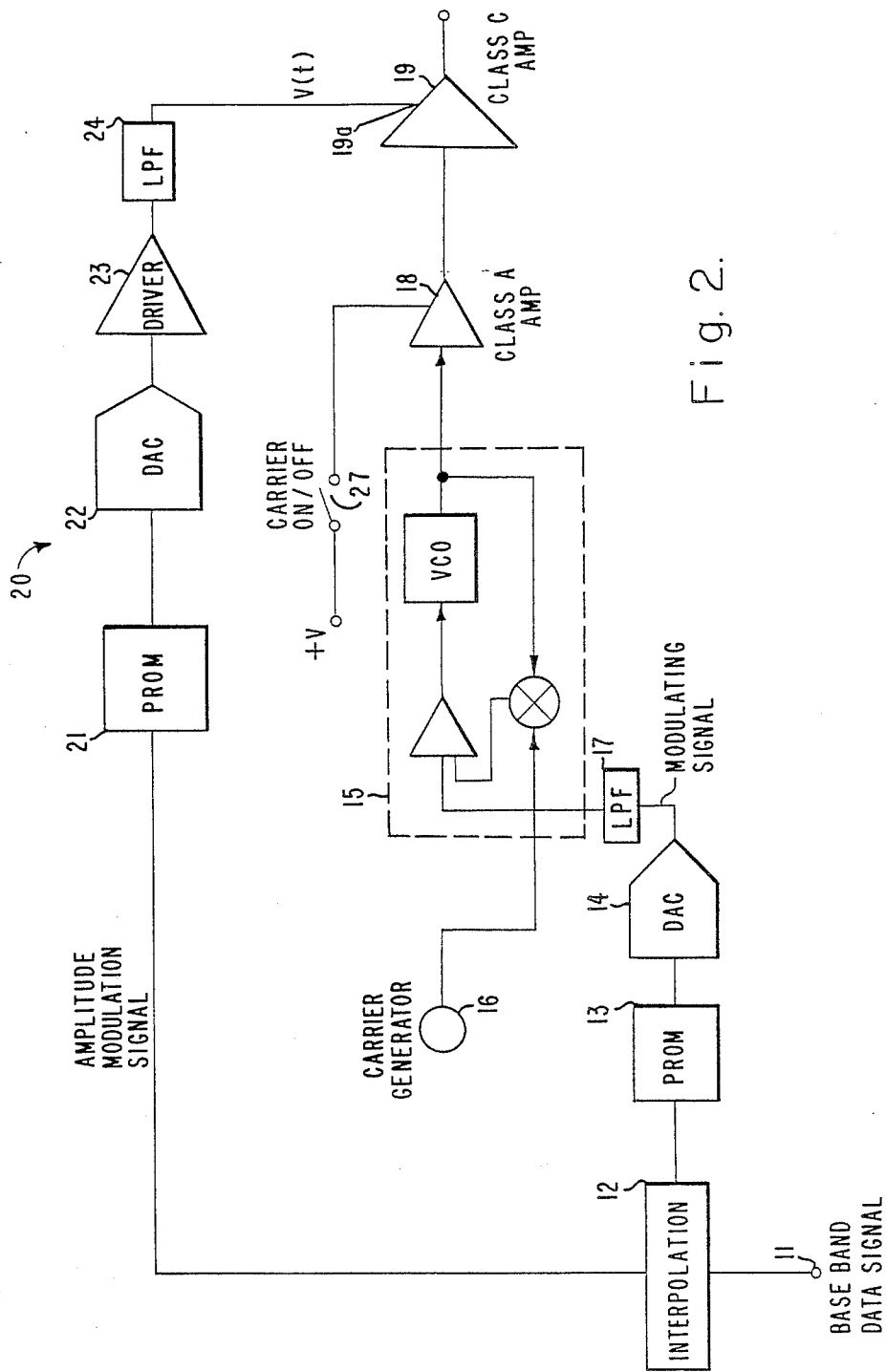
FIG. 2 illustrates a specific embodiment of the invention for using a Class C amplifier in the final amplification stages of the transmitter.

FIG. 2 illustrates a specific embodiment of the present invention which will provide a modulated carrier signal containing a spectrum within the confines of that shown in FIG. 1. In this circuit, a Class C amplifier 19 is shown as the final amplification stage for the transmitted signal. This Class C amplification stage 19 includes a DC voltage input 19a which is suitable for amplitude modulating a carrier signal being amplified by the Class C amplifier. As is known to those skilled in the art, many Class C amplifiers can be used as amplitude modulators by applying a modulation voltage to the normal DC supply voltage input. Although the embodiment of FIG. 2 was designed specifically to transmit digitized telephone traffic, it is clear that data services can also use similar apparatus to efficiently transmit these other services.

The Class C amplifier 19 is fed with a carrier signal having a zero envelope function, modulated in phase with the digitized voice and data traffic. The foregoing system is useful in 16 PSK modulation format. This carrier signal is provided by a preamplifier 18 which can be a Class A amplifier of low power consumption to provide a low level of amplitude signal for the Class C amplification stage 19.

Control over the transmitter output is effected by disabling the power amplifier 18 by power switch 27.

The carrier signal is supplied through a carrier generator 16. The foregoing system can be adapted to many carrier frequencies, L-band and UHF frequencies have been found to work well in this application. The L-band frequencies are quite effective for short distance communication. It is clear that the teachings of the invention are applicable to other longer distance communcations at other frequencies.

The L-band carrier signal is applied to a phase modulator 15. The phase modulator is a standard PSK phase modulator which, experience has dictated, will handle 16 KBPS data rates.

The modulation signal for the PSK modulator 15 is received through a low pass filter 17. Low pass filter 17 will also aid in shaping the bandwidth spectrum, as required in FIG. 1.

The data signal representing digitized telephone traffic to be phase modulated on the carrier is received in an interpolation network 12 which will provide for a digital baseband data signal carrying the voice content of a subscriber, and a corresponding amplitude modulation component which is used for shaping the envelope of the transmitted signal to maintain spectral bandwidth, as shown in FIG. 1. The generation of both the phase modulating signal and amplitude modulating signal is identical as for the previously used systems where Class A amplification was used throughout.

In the prior art telephone transmission devices, 16 PSK phase modulation was used to modulate the voice data on the carrier signal. As is known, the 16 PSK system has 16 stable phase states, each of which is capable of transmitting a data symbol or other representation of a voice sample. Associated with the voice symbol is an amplitude modulation signal. In changing phase states from any one of the 16 phase states to another phase state, an amplitude modulation function is generated. This amplitude modulation function increases as the phase shift between consecutive phase states increases. Thus, for 180° phase shift, an amplitude modulation signal component will be generated which is a substantially 100% modulation envelope function. When phase shifts of only 22½° are experienced, such as when the phase shift is between adjacent phase states of the 16 PSK function, only a minor amount of envelope modulation is needed to contain the spectrum.

In applying these prior art spectrum-containing principles to the embodiment of FIG. 2, it is necessary to have the envelope function phase aligned with the phase transitions experienced by the carrier containing the change in phase state produced by 16 PSK modulation. Phase equalization of the two modulation paths, i.e., the modulation path through phase modulator 15 and through amplitude modulation circuit 20, is accomplished by the present invention.

Figure 3:
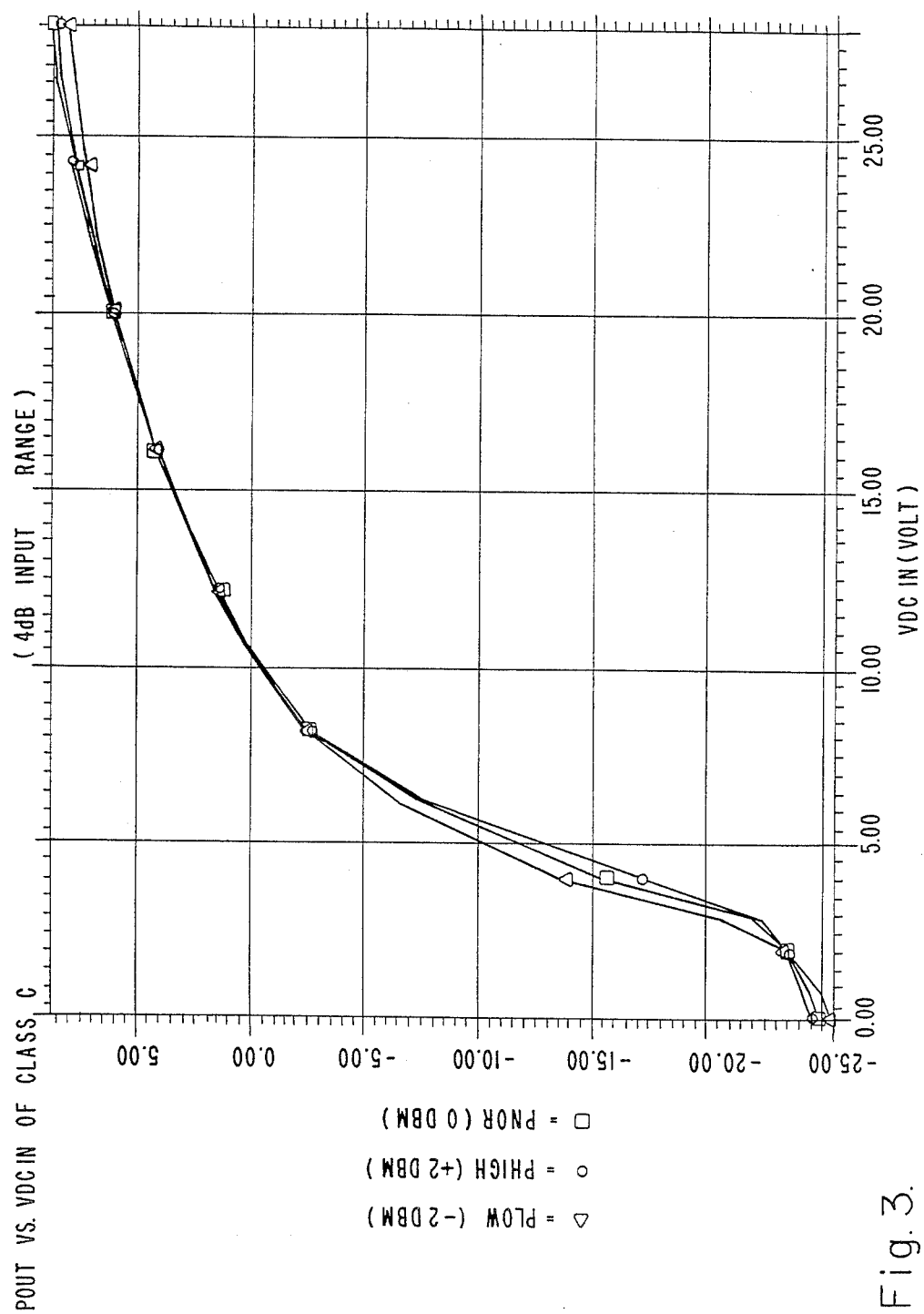
FIG. 3 illustrates the power output function of the Class C amplifier versus operating DC voltage.

As will be recognized from FIG. 3, the amplitude modulation function versus DC power voltage changes in a non-linear manner. It is possible to program PROM 21 with a table which will linearize the function shown in FIG. 3. Thus, when an amplitude modulation level is supplied by interpolation circuit 12, the PROM 21 will select the proper voltage to develope the precise envelope level for the transmitted signal.

The phase alignment between the envelope and carrier signal phase is accomplished by programming into the representative data values of PROM 21 a component which reflects the difference in delay between modulation paths. Thus, PROM 21, when addressed with a data signal from the interpolation circuit 12, will produce a data value which includes a compensation of phase shift, as well as compensation for the non-linear amplitude versus input voltage response of FIG. 3.

Resulting digital data is converted in digital-to-analog converter 22, and an appropriate driver amplifier and low pass filter 24 further condition the signal for Class C amplifier 19. Class C amplifier 19 receives the operating DC voltage on an input, which is the amplitude modulation voltage.

The amplitude modulation signal, as is evident from FIG. 3, will cause the signal produced by amplifier 19 to include an envelope function which is proportional to the voltage appearing on terminal 19a.

Figure 4:
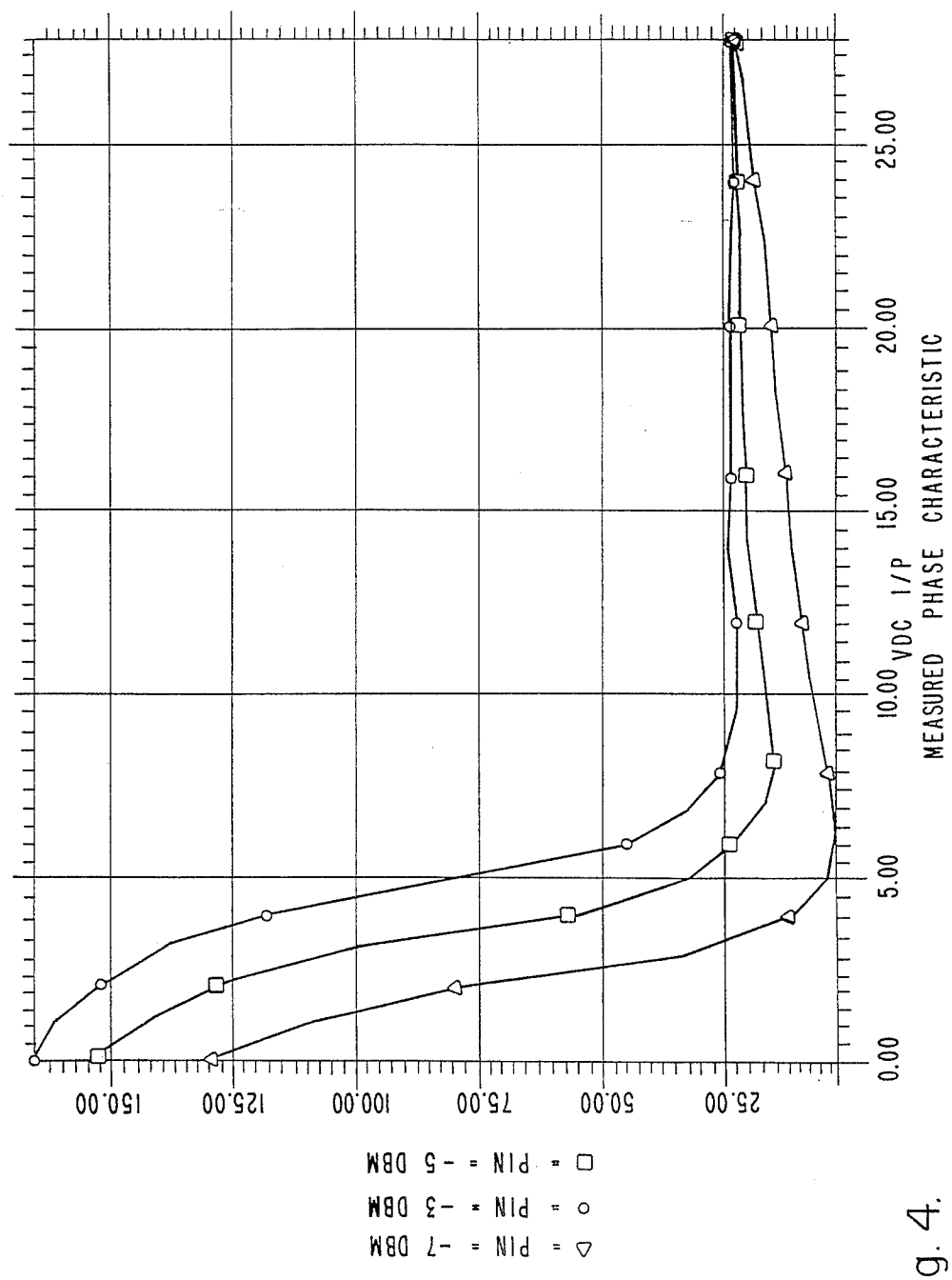
FIG. 4 illustrates the non-linear phase response of the Class C amplifier versus operating DC voltage.

However, the Class C amplifier 19 includes the disadvantage of having a phase response which also changes with the applied DC voltage. As is evident from FIG. 4, lower DC voltages, although providing the requisite amplitude function of FIG. 3, will seriously distort the phase response through amplifier 19. This phase response will result in the phase modulation being masked with an additional phase modulation component imparted to the carrier signal by virtue of attempting to amplitude modulate the Class C amplifier.

The present invention will compensate for this phase characteristic which changes as a result of applied DC voltage.

Returning to FIG. 2, there is shown an embodiment of the present invention which will correct for this measured phase change. The standard phase modulator 15, shown as a phase locked loop, which may encompass other modulator designs, receives the modulating voltage through a low pass filter 17. The carrier signal is supplied by carrier generator 16. A second PROM 13 includes digital data which will produce a given phase shift for the phase modulator 15. The PROM 13 digital data includes a component for identifying the amount of phase shift change to be effected in response to an input data signal, as well as a compensation component related to the phase shift imparted as a result of amplitude modulating Class C amplifier 19. As both the amplitude modulation signal and phase modulating signal are related, PROM 13 can include a phase offset value for each new phase state received from interpolation circuit 12. Thus, when a transition in 16 PSK is made from two consecutive phase states, the amount of phase shift offset needed will correspond to an amount of amplitude modulation required to suppress the spectrum. Thus, PROM 13 produces a data value for implementing the required phase shift for offsetting the amplifier 19 phase shift, as well as a required amount of phase shift to represent the phase state of the input data.

It is therefore seen that the Class C amplifier 19 may be used to efficiently amplify and transmit the phase modulated carrier signal having a requisite envelope function modulated thereon. The transmitted signal will be contained within the required frequency spectrum. Additionally, the amplitude modulation on the Class C amplifier will not produce any consequential phase distortion of the input carrier signal bearing the telephone traffic as a phase modulation component.

Thus, it is clear that the present invention provides for an improved transmitter having higher power efficiency and a lower net cost of manufacture as a result of employing this technology.

What is claimed is:

1. A transmitter for transmitting communication traffic from a subscriber to a base station by phase modulating a radio frequency carrier with said communication traffic, comprising:
   a carrier frequency generator;
   a phase modulating circuit for phase modulating a carrier frequency signal from said carrier frequency generator with said communication traffic to produce a phase modulated carrier signal;
   a power amplifier for efficiently amplifying said modulated carrier signal, and amplitude modulating said modulated carrier signal by controlling a power input voltage of said power amplifier, said amplifier having a phase response which is substantially non-linear with respect to changes in said power input voltage; and,
   means for adding a phase correction signal to an input of said phase modulating circuit which offsets phase changes which occur in response to changes in said power input voltage, thereby phase linearizing said amplifier.

2. A transmitter according to claim 1 wherein said means for supplying a phase correction signal is a PROM containing a plurality of phase offsets.

3. In a system for transmitting communication traffic from a subscriber to a base station via a phase modulated carrier signal, an apparatus for efficiently amplifying said carrier signal without phase distorting said signal comprising:
   an amplifier for receiving said modulated carrier signal on an input thereof, operating in a Class C mode having a phase response which is non-linear with respect to an amplitude modulating control signal; and,
   means for generating a correction signal for introducing a phase offset in said carrier signal phase in a direction opposite a phase offset in said amplifier phase response produced by an amplitude modulating control voltage applied to said amplifier, whereby said amplifier signal produces an amplified modulated carrier signal without phase distortion.

4. The apparatus of claim 3 wherein said means for generating a correction signal comprises:
   a memory containing a plurality of digital correction values which is addressed by a phase modulating signal, said memory having stored therein values of phase modulation data which includes a phase offset for correcting a phase response which is non-linear; and,
   a digital to analog voltage converter connected to receive said memory values, and generate a control voltage for phase modulating whereby said phase is linearized for varying amplitude modulation voltage signal levels.

5. The apparatus of claim 4 further comprising a linear amplifier for supplying said phase modulated carrier signal to said input of said amplifier operating in a Class C mode.

6. A transmitter for transmitting communication traffic from a subscriber to a base station by phase modulating a radio frequency carrier with said communication traffic comprising:
   a carrier frequency modulating circuit for phase modulating a carrier frequency signal with said communication traffic to produce a phase modulated carrier frequency signal;
   a Class C power amplifier for efficiently amplifying said modulated carrier frequency signal;
   an amplitude modulating circuit for amplitude modulating said Class C power amplifier with an envelope function related to changes in phase of said carrier frequency signal which suppresses sidebands produced from phase modulating said carrier; and,
   means for adding a phase offset to said carrier frequency modulating circuit in a direction to offset phase changes induced by amplitude modulating said Class C power amplifier.

7. The transmitter according to claim 6 wherein said amplitude modulating circuit includes a memory containing modulating signal levels, and a power control circuit for amplitude modulating said Class C amplifier output signal with said modulating signal levels.

8. The transmitter of claim 7 wherein said memory is addressed by a digital representation of an envelope function for reducing said phase modulated carrier frequency signal bandwidth.

9. A transmitter for transmitting telephone traffic from a subscriber to a base station by phase modulating a radio frequency carrier signal with said telephone traffic, and for controlling the frequency spectrum of said carrier signal by amplitude modulating said carrier signal with a related signal, comprising:
   a carrier frequency modulating circuit for phase modulating a carried signal with said telephone traffic to produce a phase modulated carrier frequency signal;
   a Class C amplifier for amplifying said phase modulated carrier frequency signal and amplitude modulating said carrier frequency signal with said related signal which suppresses sideband components of said phase modulated carrier frequency signal;
   a modulating voltage generator connected to supply an amplitude modulating voltage to said Class C amplifier in response to a signal representing said related signal;
   a first digital memory for containing a plurality of modulation data, addressed by a signal representing said telephone traffic, said data including a phase offset for correcting phase shift included in said Class C amplifier as a result of said amplitude modulating voltage; and, a digital to analog converter connecting said memory to said modulating circuit producing a signal for changing the phase of said carrier signal.

10. The transmitter of claim 9 further comprising:

a second digital memory for containing digital representations of an amplitude modulation function, said memory being addressed by said related signal; and, a second digital to analog converter connected to said second digital memory for generating an amplitude modulating signal for said modulating voltage generator.

11. The transmitter of claim 10 wherein said second digital memory digital representations include a phase equalizing component for phase aligning said envelope function with phase modulation on said carrier signal.

12. The transmitter of claim 10 wherein said second digital memory digital representation includes a component for linearizing the amplitude modulation response of said Class C amplifier.

* * * * *